United States Patent [19]
Hashimoto

[11] Patent Number: 5,016,222
[45] Date of Patent: May 14, 1991

[54] CIRCUIT RESPONSIVE TO A VOLTAGE CHANGE FOR DETECTING ERRONEOUS WRITING INTO A MEMORY

[75] Inventor: Kiyokazu Hashimoto, Tokyo, Japan
[73] Assignee: NEC Corporation, Japan
[21] Appl. No.: 485,629
[22] Filed: Feb. 27, 1990
[30] Foreign Application Priority Data
  Feb. 27, 1989 [JP] Japan .................................. 1-45826
[51] Int. Cl.[5] ........................ G11C 7/00; G11C 11/00; G05F 3/16
[52] U.S. Cl. .................................. 365/226; 365/195; 307/296.5; 323/316
[58] Field of Search .................... 307/296.5, 296.4, 362, 307/272.3; 323/314, 315, 316, 312; 365/195, 226, 228

[56] References Cited
FOREIGN PATENT DOCUMENTS
0106134 8/1979 Japan .................................. 365/228

Primary Examiner—Joseph A. Popek
Assistant Examiner—Jack A. Lane
Attorney, Agent, or Firm—Laff, Whitesel, Conte & Saret

[57] ABSTRACT

A circuit for detecting a power supply voltage in a memory apparatus comprises a first circuit, through which flows a first saturating current which is constant when a power supply voltage is above a predetermined value, and a second circuit, through which flows a second current which increases in proportion to the power supply voltage when it is above the predetermined value. The first circuit includes an N-channel enhancement mode insulated gate field effect transistor ("NE-IGFET"), and the second circuit includes an N-channel depletion mode insulated gate field effect transistor ("ND-IGFET"). A power supply voltage is thus detected by responsive to a difference between the threshold values of the NE-IFGET and ND-IFGET, which is not dependent on a temperature.

3 Claims, 5 Drawing Sheets

CIRCUIT RESPONSIVE TO A VOLTAGE CHANGE FOR DETECTING ERRONEOUS WRITING INTO A MEMORY

FIELD OF THE INVENTION

This invention relates to a circuit for detecting a voltage in a memory apparatus, and more particularly to, a circuit for detecting a decrease of a power supply voltage and an input high voltage in an electrically erasable and programable read-only memory (defined "EEPROM" hereinafter) including mainly insulated-gate field-effect transistors (defined "IGFETs" hereinafter).

BACKGROUND OF THE INVENTION

An EEPROM is provided with external input terminals such as a chip enable terminal $\overline{CE}$, a write enable terminal $\overline{WE}$, an output enable terminal $\overline{OE}$, etc., to be mounted in, for instance, an information processing system, so that a writing or an erasing is carried out in a writing mode which is set by aplying high and low signals to the above terminals.

One example of modes to be set is explained in the below table.

| MODE | TERMINAL | | | |
|---|---|---|---|---|
| | $\overline{CE}$ | $\overline{WE}$ | $\overline{OE}$ | I/O |
| READ | L | H | L | DATA OUTPUT |
| WRITE | L | L | H | DATA INPUT |
| STAND-BY | H | NON-SPECIFIED | NON-SPECIFIED | HIGH-IMPEDANCE |
| INHIBIT OF WRITE | NON-SPECIFIED | NON-SPECIFIED | H | |
| | NON-SPECIFIED | H | NON-SPECIFIED | |

In this table, the letter "H" is a high signal, and the letter "L" is a low signal. Furthermore, the letters "I/O" indicate an input and output terminal.

Even if one of the modes is correctly selected by applying the signals specified in the table to the respective terminals, an erroneous writing or an erroneous erasing is liable to occur in memory cells in the EEPROM, where a power supply is shut off or a voltage thereof is decreased outside an operation voltage range due to a failure, etc. of the system in which the EEPROM is mounted. For instance, where the stand-by mode is set in the state that a high signal is applied to the $\overline{CE}$ terminal, a low signal is applied to the $\overline{WE}$ terminal, and a high signal is applied to the $\overline{OE}$ terminal, it is assumed that a power supply voltage is abruptly decreased, so that the high signals of the $\overline{CE}$ and $\overline{OE}$ terminals are changed to be low. In this situation, it is further assumed that a capacitive load is connected to the $\overline{OE}$ terminal ten times faster than a capacitive load is connected to the $\overline{CE}$ terminal, so that a rate by which a voltage is changed from the high signal to a low signal at the $\overline{CE}$ terminal is faster than a rate of the change at the $\overline{OE}$ terminal. This results in a signal state of a writing mode in the above table momentarily. As a result, indefinite data on the I/O terminal having a state of a high impedance for the stand-by mode are erroneously written into an address of a memory cell.

For the purpose of avoiding such an erroneous writing occuring due to the decrease of the power supply voltage, a circuit for detecting the voltage decrease is generally built in an EEPROM system. The power supply voltage detecting circuit supplies a high signal at its output terminal, when a power supply voltage Vcc is larger than a predetermined voltage $Vcc_{(INV)}$, and a low signal at its output terminal, when the voltage Vcc is equal to or smaller than the voltage $Vcc_{(INV)}$. Consequently, the EEPROM is controlled to be in an inhibit state of a data writing, where the low signal is supplied from the output terminal of the detecting circuit. As a matter of course, the voltage $Vcc_{(INV)}$ is determined to be lower than an operating range of the power supply voltage Vcc, and is desired to be suppressed from the change thereof due to the fluctuation of an environmental temperature around the EEPROM, device parameters of transistors in fabricating the EEPROM, etc.

If it is assumed that the voltage $Vcc_{(INV)}$ is increased to be inside the operating range of the power supply voltage, a data writing becomes impossible even in an ordinary writing mode. On the contrary, if the voltage $Vcc_{(INV)}$ is set to be too low, it becomes impossible to detect the decrease of the power supply voltage Vcc precisely, so that the aforementioned erroneous writing occurs in the EEPROM.

A conventional circuit for detecting the decrease of a power supply voltage includes three Nchannel enhancement mode IGFETs (defined "NE-IGFETs" hereinafter), two N-channel depletion mode IGFET (defined "ND-IGFET" hereinafter), and an inverter, such that a high or low signal is supplied from an output terminal of the inverter dependent on a detecting result of a power supply voltage Vcc, although the structure and operation of the detecting circuit will be explained in detail later. Accordingly, an erroneous writing can be avoided in accordance with the output signal of the inverter in the detecting circuit.

However, the conventional circuit for detecting a decrease of a power supply voltage has disadvantages as follows, the cause of which will be also explained in detail later.

(1) The predetermined voltage $Vcc_{(INV)}$ is set to be three times a threshold voltage of the NE-IGFET. Therefore, where the threshold voltage is changed due to a temperature change by $\Delta V_{THN}$, the predetermined voltage $Vcc_{(INV)}$ is changed as much as 3. $\Delta V_{THN}$. As a result, the predetermined voltage $Vcc_{(INV)}$ is increased at a low temperature to be near the operating voltage range (for example, 4.5 V to 5.5 V), while the predetermined voltage $Vcc_{(INV)}$ is decreased at a high temperature, thereby making it difficult to detect a decrease of a power supply voltage precisely.

(2) In order that the predetermined voltage $Vcc_{(INV)}$ is not inside the operating voltage range at a low temperature, the predetermined voltage $Vcc_{(INV)}$ must be designed by considering a temperature characteristic of the threshold voltage of the NEIGFET. For this reason, the design of the circuit for detecting the decrease of a power supply voltage becomes difficult.

(3) The predetermined voltage $Vcc_{(INV)}$ is liable to be too low at a low temperature, thereby making it difficult to avoid an erroneous writing of the EEPROM occuring due to the decrease of the power supply voltage in a wide temperature range. Consequently, the usage temperature range of the EEPROM becomes narrow.

SUMMARY OF THE INVENTION

Accordingly, it is an object of this invention to provide a circuit for detecting a voltage in a memory apparatus, the design of which is easy.

It is a further object of this invention to provide a circuit for detecting a voltage in a memory apparatus, in which the detection of a power supply voltage is carried out in a wide temperature range.

It is a still further object of this invention to provide a circuit for detecting a voltage in a memory apparatus, by which the inhibit of an ordinary operation of the EEPROM is avoided at a high temperature, and an erroneous writing is avoided in the EEPROM at a low temperature.

According to this invention, a circuit for detecting a voltage in a memory apparatus, comprises:

a first p-channel field-effect transistor having a source connected to a power supply, and a gate and a drain commonly connected;

an n-channel depletion mode field-effect transistor having a drain connected to the drain of the first p-channel field effect transistor, and a gate and a source commonly connected to the ground;

a field-effect transistor having a gate connected to the power supply to be turned on;

a first n-channel enhancement mode field-effect transistor having a drain and a gate commonly connected to a drain of the field-effect transistor and a source connected to the ground;

a second p-channel field-effect transistor having a source connected to the power supply, a gate connected to a common node between the first p-channel field-effect transistor and the n-channel depletion mode field-effect transistor, and a drain connected to a voltage detecting node;

a second n-channel enhancement mode field-effect transistor having a drain connected through the voltage detecting node to the drain of the second p-channel field-effect transistor, a gate connected to a common node between the field-effect transistor and the first n-channel mode enhancement mode field-effect transistor, and a source connected to the ground; and an inverter connected between the power supply and the ground, and having an input terminal connected to the voltage detecting node and an output terminal for providing a voltage detected result.

BRIEF DESCRIPTION OF THE DRAWINGS

This invention will be explained in more detail in conjunction with appended drawings, wherein.

DESCRIPTION OF THE PREFERRED EMBODIMENTS

Before explaining a circuit for detecting a voltage in a memory apparatus in a preferred embodiment according to the invention, the aforementioned conventional circuit for detecting a power supply voltage in an EEPROM will be explained again.

Figure 1:
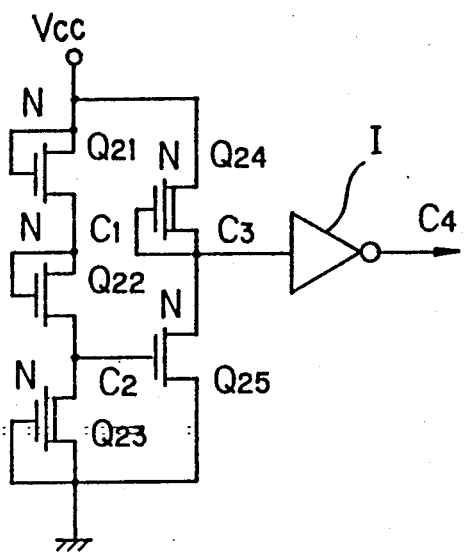
FIG. 1 is a circuitry diagram showing a conventional circuit for detecting a decrease of a power supply voltage in a memory apparatus.

FIG. 1 shows the conventional circuit for detecting a power supply voltage which comprises NEIGFETs $Q_{21}$, $Q_{22}$ and $Q_{25}$, ND-IGFETs $Q_{23}$ and $Q_{24}$, and an inverter I connected between a power supply CC and the ground, wherein the NE-IGFETs and ND-IGFETs $Q_{21}$ to $Q_{25}$ are connected via nodes $C_1$, $C_2$ and $C_3$ to each other, and the inverter I is connected at an input terminal to the mode $C_3$ and at an output terminal to the node $C_4$. In this circuit, each IGFET is designed in regard to a ratio of a gate width to a gate length (defined "W/L" hereinafter), such that an equivalent resistance of $Q_{23}$ is higher than those of $Q_{21}$ and $Q_{22}$, and an equivalent resistance of $Q_{24}$ is higher than that of $Q_{25}$. For instance, the ratio of W/L is designed to be 60/3 for $Q_{21}$ and $Q_{22}$, 6/2000 for $Q_{23}$ and $Q_{24}$, and 60/3 for $Q_{25}$. Therefore, currents flowing through $Q_{21}$ to $Q_{23}$, and through $Q_{24}$ and $Q_{25}$ are as small as approximately 0.5 µA. Furthermore, a logic threshold value of an inverter composed of $Q_{24}$ and $Q_{25}$ is set to be $V_{THN}$ which is a threshold value common to the NE-IGFETs.

Figure 2:
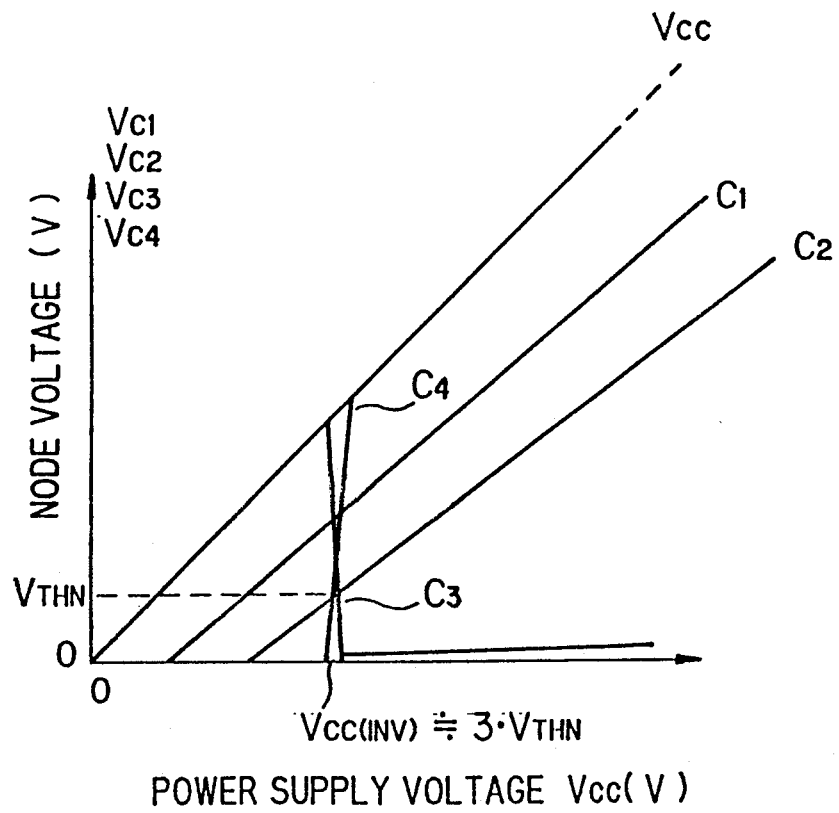
FIG. 2 is an explanatory diagram showing voltages changing at nodes $C_1$, $C_2$, $C_3$ and $C_4$ in acordance with the change of a power supply voltage.

In operation, a voltage Vcc of a power supply CC is applied to the circuit, so that voltages $VC_1$, $VC_2$, $VC_3$ and $VC_4$ of the nodes $C_1$ to $C_4$ are changed, where the voltage Vcc is changed, as shown in FIG. 2.

$$Vcc > 3 \cdot V_{THN} \qquad (1)$$

The voltage $VC_2$ is higher at the node $C_2$ than the threshold voltage $V_{THN}$, so that the voltage $VC_3$ is 0 V (the ground level) at the node $C_3$, and the voltage $VC_4$ is Vcc at the node $C_4$.

$$Vcc \leq 3 \cdot V_{THN} \qquad (2)$$

As the power supply voltage Vcc is decreased, the voltages $VC_1$ and $VC_2$ of the nodes $C_1$ and $C_2$ are also decreased. Where the voltage $VC_2$ becomes equal to or less than the threshold voltage $V_{THN}$, the voltage $VC_3$ of the node $C_3$ is Vcc, and the voltage $VC_4$ of the node $C_4$ is 0 V.

Accordingly, the predetermined voltage $Vcc_{(INV)}$ which is a reference voltage in detecting the decrease of a power supply voltage is expressed by the equation (1).

$$Vcc_{(INV)} \approx 3 \cdot V_{THN} \tag{1}$$

The threshold voltage $V_{THN}$ is expressed, as described in "the Physics and Technology of Semiconductor Devices", by the equation (2).

$$V_{THN} = V_{FBP} + 2\phi_{FP} + \frac{2K_s \epsilon_0 qN_A (2\phi_{FP})}{Cox} \tag{2}$$

where $V_{FBP}$ is a flat-band potential of a p-semiconductor substrate,
$\phi$ is a Fermi level of a p-semiconductor substrate ($\phi_{FP} > 0$),
Cox is a gate capacitance per a unit area,
Ks is a dielectric constant of a substrate,
$\epsilon_0$ is a permittivity of vacuum, and
$N_A$ is an acceptor concentration of a p-semiconductor substrate.
In the following explanation, it is presumed that, $Ks = 11.8$, $\epsilon_0 = 8.854 \times 10^{-12} (F/m)$, $Cox = \epsilon_0 \cdot K_{ox}/t_{ox}$, and $Kox = 3.8$.

In the equation (2), $V_{FBP}$ is expressed by the equation (3).

$$V_{FBP} = \phi\mu - \phi sp \tag{3}$$
$$= 1/q (-qX - Eg/2 - kT \ln N_A/Ni)$$

where $\phi\mu$ is a work function of an aluminum electrode,
$\phi sp$ is a work function of a p-semiconductor,
X is an electron affinity of silicon,
Eg is an energy gap of silicon,
k is Boltzmann constant,
T is absolute temperature, and
Ni is an intrinsic carrier concentration.
In the following explanation, it is presumed that, $k = 8.62 \times 10^{-5}$ eV/K, and Eg = 1.1 eV.
In the equation (2), $\phi_{FP}$ is expressed by the equation (4).

$$\phi_{FP} = kT/q \ln N_A/Ni \tag{4}$$

In the equations (2) to (4), the below described values are substituted.

$\phi\mu = 4.252V$, $X = 4.1V$, $Eg = 1.1eV$, $Cox = 0.067 \times 10^{-2} F/m$ (500 Å), $Ks = 11.8$, $N_A = 2.5 \times 10^{22}/m^3$, and $Ni = 1.45 \times 10^{16}/m^3$ (at a temperature of 25° C.).

Thus, $\phi_{FP}$ is expressed at a temperature of 25° C. by the equation (5).

$$\phi_{FP} = 0.37V \tag{5}$$

The threshold voltage $V_{THN}$ is expressed at a temperature of 25° C. by the equation (6), as a result of the substitution of the above described values into the equation (2).

$$V_{THN} = (-0.77 V) + (0.74 V) + (1.17 V) \tag{6}$$
$$= 1.14 V$$

Accordingly, the predetermined value $Vcc_{(INV)}$ is expressed at a temperature of 25° C. by the equation (7).

$$Vcc_{(INV)} = 3 \times 1.14 V \tag{7}$$
$$= 3.42 V$$

On the other hand, $\phi_{FP}$ is expressed at a temperature of 100° C. by the equation (8), where Ni is presumed to be $2 \times 10^{18}/m^3$.

$$\phi_{FP} = 0.30V \tag{8}$$

Furthermore, the threshold voltage $V_{THN}$ is expressed at a temperature of 100° C. by the equation (9), as explained in the equation (6). Here, Eg is not changed dependent on a temperature.

$$V_{THN} = (-0.70 V) + (0.60 V) + (1.05 V) \tag{9}$$
$$= 0.95 V$$

Accordingly, the predetermined voltage $Vcc_{(INV)}$ is expressed at a temperature of 100° C. by the equation (10).

$$Vcc = 3 \times 0.95 V \tag{10}$$
$$= 2.85 V$$

Figure 3:
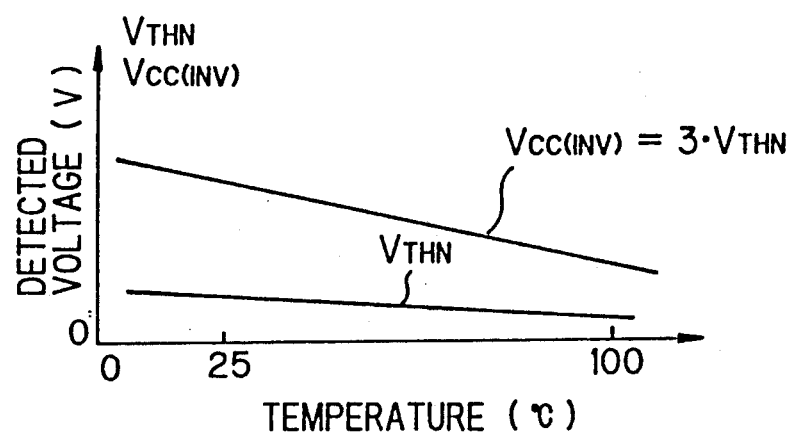
FIG. 3 is an explanatory diagram showing the change of a predetermined voltage to be detected in the circuit in FIG. 1.

As understood from the above calculations, the predetermined voltage $Vcc_{(INV)}$ which is a reference voltage in detecting a decrease of a power supply voltage is changed between 2.85 V and 3.42 V in accordance with a temperature change between 100° C. and 25° C. In other words, the voltage $Vcc_{(INV)}$ is changed by a voltage range of 0.57 V, as a temperature is changed by a range of 75° C. This phenomenon of the conventional circuit is shown in FIG. 3. As apparent therefrom, the predetermined voltage $Vcc_{(INV)}$ which is three times the threshold voltage $V_{THN}$ is decreased in an accordance with a negative temperature coefficient, along with the decrease of the threshold voltage $V_{THN}$.

Next, a circuit for detecting a voltage in a memory apparatus in the first preferred embodiment according to the invention will be explained in FIG. 4. The detecting circuit comprises P-channel enhancement mode IGFETs (defined "PE-IGFET" hereinafter) $Q_1$ and $Q_5$, ND-IGFETs $Q_2$ and $Q_3$, NE-IGFETs $Q_4$ and $Q_6$, and an inverter connected between a power supply CC and the ground. In this detecting circuit, a ratio of "W/L" for each IGFET is designed, such that an equivalent resistance of $Q_2$ is larger than that of $Q_1$, an equivalent resistance of $Q_4$ is larger than that of $Q_3$, a ratio of "W/L" for $Q_5$ is larger than that for $Q_1$ by n times, and a ratio of "W/L" for $Q_6$ is larger than that for $Q_4$ by n times. Therefore, current $IL_1$ flowing through $Q_1$ and $Q_2$ is determined by a current derived power of $Q_2$, and current $IL_2$ flowing through $Q_3$ and $Q_4$ is determined by a current derived power of $Q_4$. For instance, the ratio of "W/L" is designed to be 10/3 for $Q_1$ and $Q_5$, and 6/2000 for $Q_2$, $Q_4$ and $Q_6$, and the numbers of "m" and "n" are presumed to be "1" (m=n=1).

In such an instance, the currents of $IL_1$ and $IL_2$ are very small to be several 100 nA, respectively, where the power supply voltage Vcc is 5 V.

Figure 4:
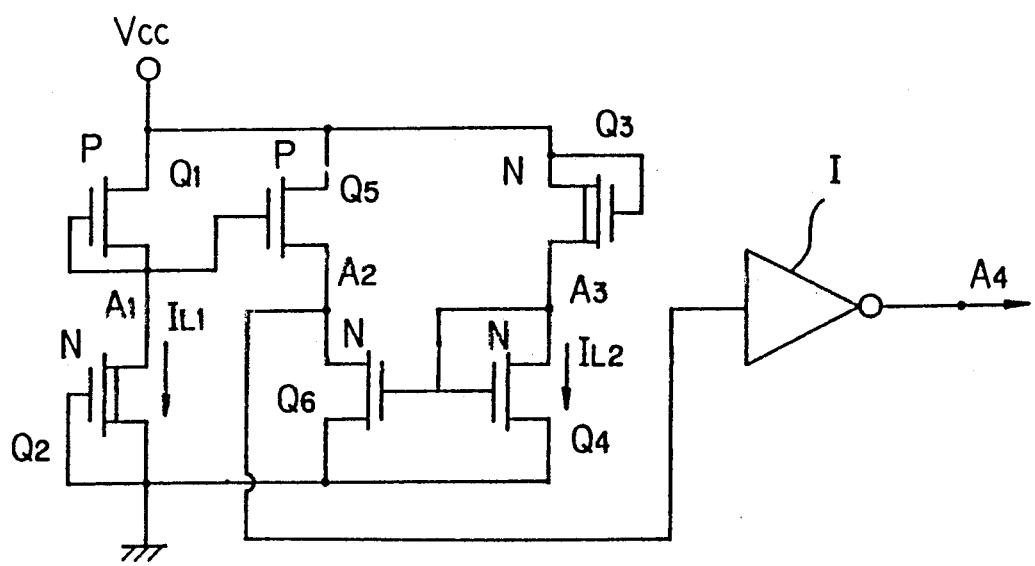
FIG. 4 is a circuitry diagram showing a circuit for detecting a decrease of a power supply voltage in a memory system in a first preferred embodiment according to the invention.
Figure 5:
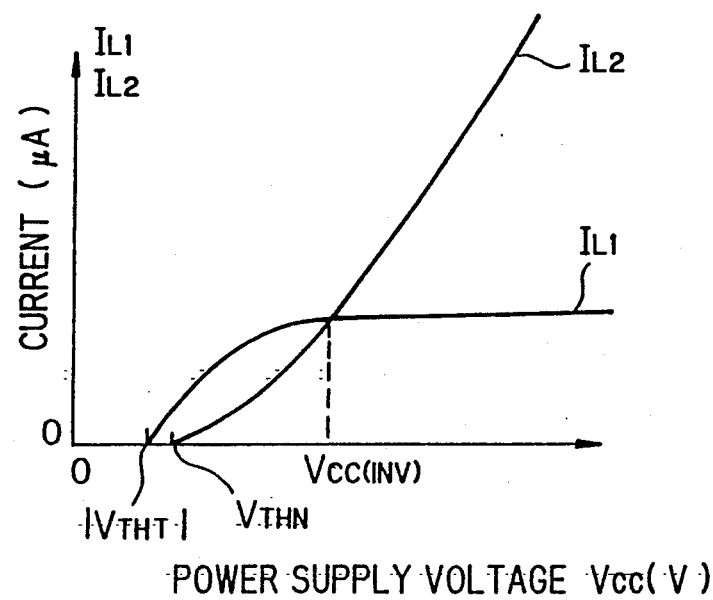
FIG. 5 is an explanatory diagram showing the change of currents $IL_1$ and $IL_2$ in accordance with the change of a power supply voltage.
Figure 6:
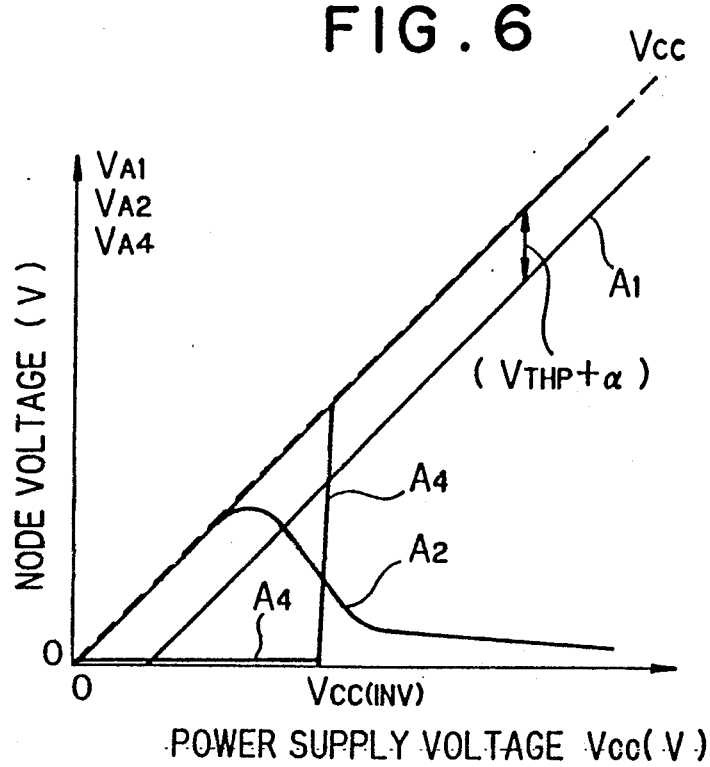
FIG. 6 is an explanatory diagram showing voltages at nodes $A_1$, $A_2$ and $A_4$ changing in accordance with the change of a power supply voltage.

Operation of the circuit as shown in FIG. 4 will be explained in conjunction with FIGS. 5 and 6, wherein the currents of $IL_1$ and $IL_2$ are changed dependent on the power supply voltage Vcc in FIG. 5, and voltages $VA_1$, $VA_2$ and $VA_4$ are changed at nodes $A_1$, $A_2$ and $A_4$ dependent on the power supply voltage Vcc in FIG. 6. As shown in FIG. 6, the voltage $VA_1$ is fixed at the node $A_1$ to be "Vcc$-(|V_{THP}|+\alpha)$" which is a voltage difference necessary for the flowing of the current $IL_1$ through $Q_1$, where $V_{THP}$ is a threshold voltage of the PE-IGFETs. The current $IL_1$ is determined by the equivalent resistance of $Q_2$. Therefore, where the power supply voltage Vcc is increased to be larger than the threshold voltage $|V_{THP}|$ (Vcc$>|V_{THP}|$), $Q_1$ is turned on, so that the current $IL_1$ which is determined by a current to voltage characteristic of $Q_2$ as shown in FIG. 5 flows through $Q_2$.

On the other hand, the voltage $VA_3$ is fixed at the node $A_3$ to be of the power supply voltage Vcc, and the current $IL_2$ is determined by the equivalent resistance of $Q_4$. Therefore, where the power supply voltage Vcc is increased to be larger than the threshold voltage $V_{THN}$ of the NE-IGFET $Q_3$, $Q_4$ is turned on, so that the current $IL_2$ which is determined by a current to voltage characteristic of $Q_4$ flows through $Q_4$. As shown in FIG. 4, $Q_1$ and $Q_5$, and $Q_4$ and $Q_6$ are connected to provide current mirror circuits, so that $Q_5$ operates to supply the node $A_2$ with the current $IL_1$, and $Q_6$ operates to supply the ground with the current $IL_2$. The ratio of "W/L" is designed for $Q_2$ and $Q_4$, such that the currents of $IL_1$ and $IL_2$ are equal to each other, where the power supply voltage Vcc is equal to the predetermined voltage $Vcc_{(INV)}$, as shown in FIG. 5. Furthermore, the threshold voltage $V_{THN}$ of $Q_2$ is designed, such that $Q_2$ operates in a saturated region, where the power supply voltage Vcc is equal to or larger than the predetermined voltage $Vcc_{(INV)}$ (Vcc$\geq Vcc_{(INV)}$). Consequently, the current $IL_1$ is constant without any dependency of the power supply voltage Vcc.

On the other hand, the current $IL_2$ is proportional to (Vcc$-V_{THN}$), because a gate and a drain of $Q_4$ are commonly connected.

Next, the voltages $VA_1$, $VA_2$ and $VA_4$ of the nodes $A_1$, $A_2$ and $A_4$ will be explained to be changed, where the power supply voltage Vcc is decreased to be lower than a designed value.

Vcc$>Vcc_{(INV)}$

As shown in FIG. 5, the current $IL_2$ is larger than the current $IL_1$. At this time, the voltage $VA_2$ of the node $A_2$ is determined by a ratio of current derived powers of $Q_5$ and $Q_6$. Therefore, the voltage $VA_2$ becomes near the ground potential to be lower than a logic threshold value of the inverter I, because the current derived power of $Q_6$ is larger than that of $Q_5$, so that the power supply voltage Vcc is applied to the node $A_4$ by the inverter I.

(2) Vcc$=Vcc_{(INV)}$

Where the power supply voltage Vcc is decreased to be equal to the predetermined voltage $Vcc_{(INV)}$, the currents of $IL_1$ and $IL_2$ become equal to each other. Therefore, the current derived powers of $Q_5$ and $Q_6$ become equal to each other, so that the voltage $VA_2$ is increased at the node $A_2$. As a result, the currents flowing through $Q_5$ and $Q_6$ are equal to the currents of $IL_1$ and $IL_2$.

(3) Vcc$<Vcc_{(INV)}$

Where the power supply voltage Vcc is more decreased to be lower than the predetermined voltage $Vcc_{(INV)}$, the current $IL_1$ becomes larger than the current $IL_2$. As a result, the current derived power of $Q_5$ becomes larger than that of $Q_6$, so that the voltage $VA_2$ becomes at the node $A_2$ near the power supply voltage Vcc. At this time, the voltage $VA_2$ is higher than the logic threshold value of the inverter I, so that the voltage $VA_4$ of the node $A_4$ is 0 V.

Furthermore, a level of the predetermined voltage $Vcc_{(INV)}$ which is detected to inhibit a writing mode of EEPROM by the circuit for detecting the decrease of a power supply voltage in the preferred embodiment will be obtained as follows. As described before, the power supply voltage Vcc, by which values are equal between the currents of $IL_1$ and $IL_2$ ($IL_1 = IL_2$), is the predetermined value $Vcc_{(INV)}$. The current $IL_1$ is expressed by the equation (11), because $Q_2$ operates in the saturated region.

$$IL_1 = \frac{\beta_D}{2}(-V_{THD})^2 \qquad (11)$$

where $\beta_D = W/L \cdot \mu_D \cdot Cox$ for $Q_2$,
$\mu_D$ is a mobility of the ND-IGFET, and
Cox is a gate capacity of a unit area.

The current $IL_2$ is expressed by the equation (12), because $Q_4$ operates in the saturated region in the same manner.

$$IL_2 = \frac{\beta_N}{2}(Vcc - V_{THN})^2 \qquad (12)$$

where $\beta_N = W/L \cdot \mu_N \cdot Cox$ for $Q_4$, and
$\mu_N$ is a mobility of the NE-IGFETs $Q_4$ and $Q_6$.

The predetermined voltage $Vcc_{(INV)}$ is expressed by the equation (13), where the equation (11) is equal to the equation (12), and the power supply voltage Vcc is equal to the predetermined voltage $Vcc_{(INV)}$.

$$Vcc_{(INV)} = V_{THN} + \sqrt{\frac{\beta_D}{\beta_N}}(-V_{THD}) \qquad (13)$$

If it is assumed that the ratio of "W/L" is designed, such that $\beta_N$ is equal to $\beta_D$, the equation (13) is expressed by the equation (14).

$$Vcc_{(INV)} = V_{THN} - V_{THD} \qquad (14)$$

In the equation (14), $V_{THN}$ is expressed by the aforementioned equation (2), and $V_{THD}$ is expressed by the equation (15).

$$V_{THD} = V_{FBP} + 2\phi FP + \frac{2K_s \epsilon_0 qN_A(2\phi_{FP})}{C_{ox}} - \frac{qT_cN_c}{C_{ox}} \quad (15)$$

where Nc is a donor concentration of the IGFET to be a depletion type, and

Tc is a donor depth of a substrate.

Where the equations (2) and (5) are substituted into the equation (14), the equation (16) is obtained.

$$V_{cc(INV)} = \frac{qT_cN_c}{C_{ox}} \quad (16)$$

Figure 7:
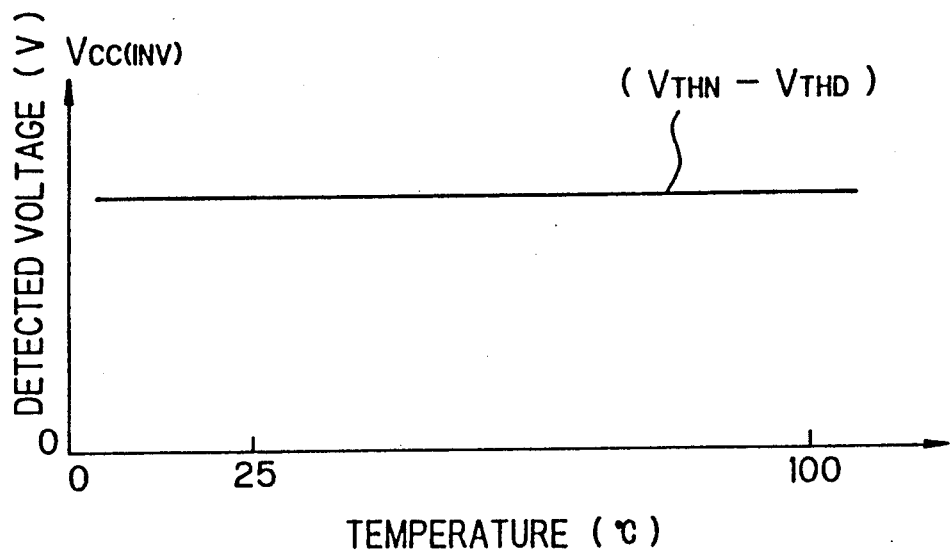
FIG. 7 is an explanatory diagram showing a predetermined voltage to be detected which is not changed dependent on a temperature.

In the equation (16), Tc, Nc and Cox are not changed substantially in regard to a temperature, so that the predetermined voltage $V_{cc(INV)}$ is not changed substantially in regard to a temperature as shown in FIG. 7.

For instance, if it is assumed that, $Tc = 10^{-7}$ m, $Nc = 1.38 \times 10^{23}/m^3$, and $Cox = 0.067 \times 10^{-2} F/m^2$ the predetermined voltage $V_{cc(INV)}$ is 3.3 V as follows.

$$V_{cc(INV)} = \frac{1.6 \times 10^{-19} \times 10^{-7} \times 1.38 \times 10^{23}}{0.067 \times 10^{-2}}$$
$$= 3.3 \text{ V}$$

In conclusion, the detected voltage is constant to be 3.3 V in the circuit for detecting a power supply voltage according to the invention, even if a temperature is changed.

As understood from the above, a detected voltage $V_{cc(INV)}$ is set to be a difference between threshold values of NE- and ND-IGFETs, so that the three terms of the equation (2), that is, the front three terms of the equation (15) which are changed dependent on a temperature are eliminated therefrom. Therefore, only the term which is not changed substantially dependent on a temperature is left therein, so that a temperature dependency of a voltage which is detected in the circuit for detecting a power supply voltage according to the invention is negligible as compared to the conventional one. Furthermore, a degree of freedom for setting a voltage to be detected is increased as compared to a case where a voltage is set to be detected in the multiplication of the threshold voltage $V_{THN}$ by n (n:an integer), as described in the conventional circuit, because a voltage is set to be detected in accordance with the conditions of injecting ions such as a kind of substances to be injected, a doping amount, an accelerating energy, etc.

Figure 8:
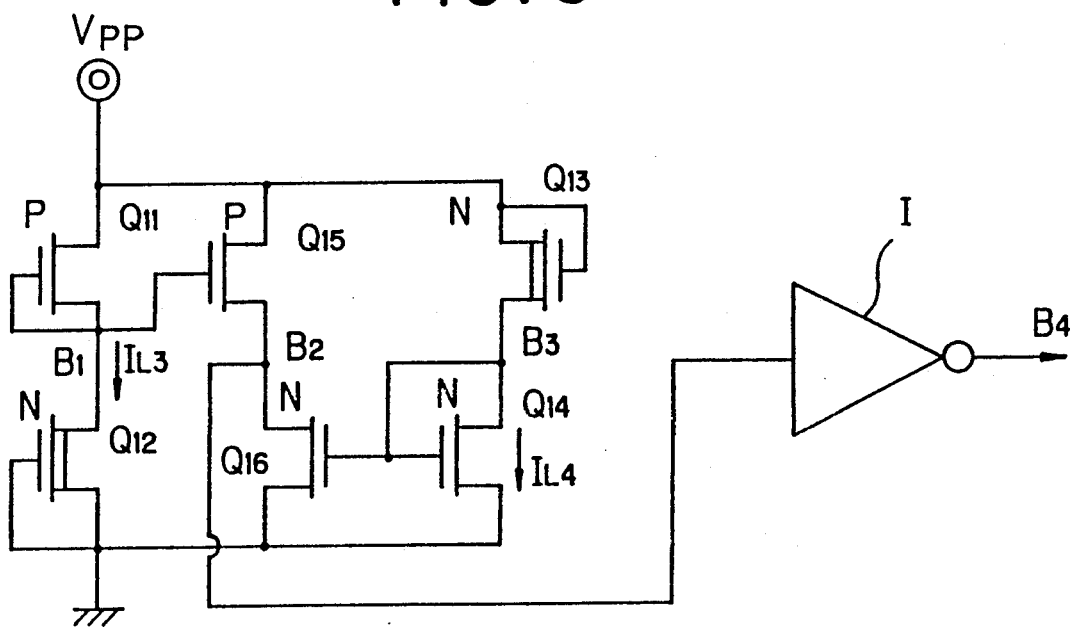
FIG. 8 is a circuitry diagram showing an input high voltage detecting circuit in a second preferred embodiment according to the invention.

FIG. 8 shows a circuit for detecting a power supply voltage in a memory apparatus in the second embodiment according to the invention which is applied to a circuit for detecting an input high voltage in an electrically programmable read-only memory (EPROM). In FIG. 8, $Q_{11}$ and $Q_{15}$ are PE-IGFETs, $Q_{12}$ and $Q_{13}$ are ND-IGFETs, $Q_{14}$ and $Q_{16}$ are NE-IGFETs, PP is an external input terminal, and I is an inverter, wherein a threshold voltage of $Q_{14}$ and $Q_{16}$ is set to be $V_{THN-H}$ which is larger than a threshold voltage $V_{THN}$ of an NE-IGFET, and a ratio of "W/L" for each IGFET is set in the same manner as in the first preferred embodiment.

Figure 9:
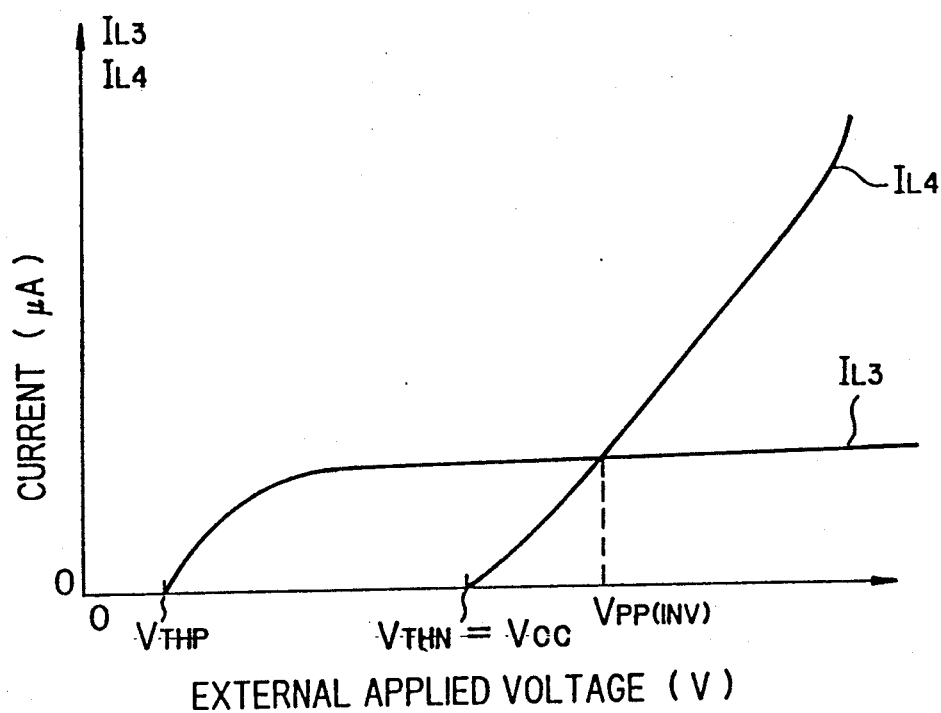
FIG. 9 is an explanatory diagram showing the change of currents $IL_3$ and $IL_4$ in accordance with the change of an external applied voltage in FIG. 8.
Figure 10:
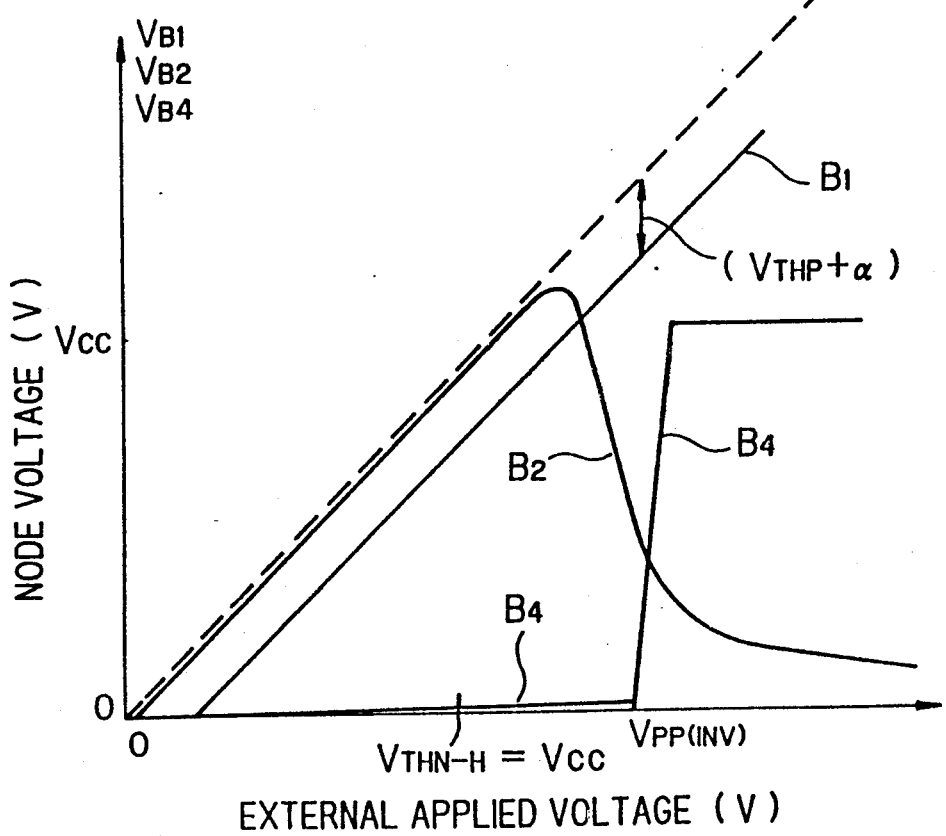
FIG. 10 is an explanatory diagram showing the change of voltage at nodes $B_1$, $B_2$, and $B_4$ in accordance with the change of the external applied voltage.

In operation, current $IL_3$ flows through $Q_{11}$ and $Q_{12}$, and current $IL_4$ flows through $Q_{13}$ and $Q_{14}$, where a voltage Vpp is changed to be applied to the external input terminal PP, as shown in FIG. 9. In this circumstance, voltages $VB_1$, $VB_2$, and $VB_4$ are changed at nodes $B_1$, $B_2$, and $B_4$, where the voltage Vpp is changed. In the second preferred embodiment, the voltage $V_{THN-H}$ is set to be the power supply voltage Vcc (=5 V), and the ratio of "W/L" for $Q_{12}$ and $Q_{14}$ is designed, such that the current $IL_3$ is equal to the current $IL_4$ ($IL_3 = IL_4$), where the applied voltage Vpp is a predetermined voltage $Vpp_{(INV)}$. As a matter of course, the current $IL_3$ is determined by an equivalent current of $Q_{12}$, and the current $IL_4$ is determined by an equivalent current of $Q_{14}$ in the same manner as in the first preferred embodiment. Furthermore, $Q_{11}$ and $Q_{15}$, and $Q_{14}$ and $Q_{16}$ provide current mirror circuits. The below explanation is for voltage changes of the nodes $B_1$ to $B_4$ in operation, where the applied voltage Vpp is increased from 0 V.

(1) $Vpp < V_{THN-H} = 5$ V

Where the applied voltage Vpp becomes larger than $|V_{THP}|$, $Q_{11}$ is turned on, so that current $IL_3$ flows through $Q_{11}$ and $Q_{12}$. At this time, a voltage $VB_3$ is approximately [Vpp] at the node $B_3$, while $Q_{14}$ is non-conductive. Accordingly, $Q_{15}$ is conductive, and $Q_{16}$ is non-conductive, while a voltage $VB_2$ is [Vpp] at the node $B_2$, and a voltage is 0 V at the node $B_4$.

(2) $V_{THN-N} \leq Vpp < Vpp_{(INV)}$

Where the applied voltage Vpp becomes a value which is equal to or larger than the voltage $V_{THN-H}$, and smaller than $Vpp_{(INV)}$, the current $IL_3$ is not changed, even if the applied voltage is changed, because $Q_{12}$ operates in the saturated region. On the other hand, $Q_{14}$ is turned on, so that the current $IL_4$ flows through $Q_{13}$ and $Q_{14}$. As a result, a voltage $VB_2$ is decreased at the node $B_2$ from the applied voltage Vpp in accordance with the increase of the applied voltage Vpp, because the voltage $VB_2$ is determined by current derived powers of $Q_{15}$ and $Q_{16}$. At this moment, a voltage $VB_4$ is still 0 V, because the voltage $VB_2$ is set to be more than a logic threshold value of the inverter I.

(3) $Vpp = Vpp_{(INV)}$

Where the applied voltage Vpp is equal to the predetermined voltage $Vpp_{(INV)}$ in accordance with the increase of the applied voltage Vpp, the currents $IL_3$ and $IL_4$ are equal to each other ($IL_3 = IL_4$). Accordingly, the current derived powers of $Q_{15}$ and $Q_{16}$ are equal to each other to decrease the voltage $VB_2$, so that the current $IL_3$ flowing through $Q_{15}$ and the current $IL_4$ flowing through $Q_{16}$ are equal to each other.

(4) $Vpp > Vpp_{(INV)}$

Where the applied voltage Vpp is more increased to be larger than $Vpp_{(INV)}$ ($Vpp > Vpp_{(INV)}$), the curent $IL_4$ is larger than the current $IL_3$ ($IL_4 > IL_3$). At this moment, the voltage $VB_2$ is more decreased to be lower than the logic threshold value of the inverter I, because the current derived power of $Q_{16}$ is larger than that of $Q_{15}$. Therefore, the voltage $VB_4$ is [Vcc] at the node $B_4$.

Next, the predetermined voltage $Vpp_{(INV)}$ which is detected in the input high voltage detecting circuit in the second preferred embodiment will be calculated. As explained in the first preferred embodiment, a value of the applied voltage Vpp which meets the relation ($IL_3 = IL_4$) is the predetermined voltage $Vpp_{(INV)}$. The current $IL_3$ is expressed by the equation (11) in the first preferred embodiment, and the current $IL_4$ is expressed by the equation (17).

$$IL_4 = \frac{\beta_{NH}}{2}(Vcc - V_{THN-H})^2 \tag{17}$$

where $\beta_{NH} = W/L \cdot \mu_{NH} \cdot Cox$ for $Q_{14}$, and
$\mu_{NH}$ is mobilities of the NE-IGFET $Q_{14}$ and $Q_{16}$.

If it is assumed that the ratio of "W/L" is designed for $Q_{11}$ and $Q_{14}$, such that $\beta_{NH}$ is equal to $\beta_D$, where the equation (11) is equal to the equation (17), the equation (18) is obtained.

$$Vpp_{(INV)} = V_{THN-H} - V_{THD} \tag{18}$$

Here, if it is assumed that a concentration and a depth of acceptor which is injected below a gate of a substrate is $N_{AC}$ and $T_A$, respectively, the voltage $V_{THN-H}$ is expressed by the equation (19).

$$V_{THN-H} = V_{FBP} + 2\phi_{FP} + \frac{\sqrt{2K_{s\epsilon_0} N_A (2\phi_{FP})}}{Cox} \tag{19}$$
$$= \frac{qT_A N_{AC}}{Cox}$$

Thus, the voltage $Vpp_{(INV)}$ is expressed by the equation (20), because the voltage $V_{THD}$ is expressed by the equation (15) as explained in the first preferred embodiment.

$$Vpp_{(INV)} = \frac{qT_c N_c}{Cox} + \frac{qT_A N_{AC}}{Cox} \tag{20}$$

For instnce, if it is assumed that, $Tc = 10^{-7}$ m, $Nc = 1.38 \times 10^{23}/m^3$ $Cox = 0.067 \times 10^{-2}$ F/m$^2$ $T_A = 10^{-7}$ m, and $N_{AC} = 2.1 \times 10^{23}/m^3$ the voltage $Vpp_{(INV)}$ is calculated below.

$Vpp_{(INV)} = 3.3V + 5V = 8.3V$

In the equation (20), the voltage $Vpp_{(INV)}$ is not changed substantially dependent on a temperature, because $Tc$, $Nc$, $T_A$, $N_{AC}$ and Cox are not changed substantially dependent on a temperature. Accordingly, the same advantage as explained in the frst preferred embodiment is obtained in the second preferred embodiment.

Although an ND-IGFETm, a gate and a drain of which are conmonly connected, is utilized for Q3 in the first and second preferred embodiments, a circuit structure, in which Q3 is always turned on, and a power supply voltage is obtained at a node A3, for instance, an ND-IGFET, a gate and a source of which are commonly connected, a PE-IGFET, a gate of which is connected to the ground, etc. may be utilized.

As understood from the above, following advantages are expected in a circuit for detecting a decrease of a power supply voltage, and a circuit for detecting an input high voltage according to the invention.

(1) A detected voltage is not changed substantialy dependent on a temperature, because the detected voltage is determined by a difference of threshold values of NE-IGFET and ND-IGFET, so that terms which are changed dependent on a temperature are all eliminated.

(2) A detected voltage is set to be an arbitrary value, because the detected voltage is set by the ion injection conditions such as a kind of substanees to be injected, a doping amount, an accelerating energy, etc.

Consequently, an EEPROM which is built in a system operating in a wide temperature range can be provided in a market, because an erroneous writing is precisely avoided, even a power supply voltage is decreased in a wide temperature range.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A circuit for detecting a power supply voltage in a memory system, comprising:
   a first P-channel field-effect transistor having a source connected to a power supply, and a commonly connected gate and drain;
   an N-channel depletion mode field-effect transistor having a drain connected to said drain of said first P-channel field-effect transistor, and a gate and a source commonly connected to a ground;
   a turned on field-effect transistor having a gate and a source connected to said power supply;
   a first N-channel enhancement mode field-effect transistor having a drain and a gate commonly connected to a drain of said turned on field effect transistor and a source connected to the ground;
   a second P-channel field-effect transistor having a source connected to said power supply, a gate connected to a common node between said first P-channel field-effect transistor and said N-channel depletion mode field-effect transistor, and a drain connected to a voltage detecting node;
   a second N-channel enhancement mode field-effect transistor having a drain connected through said voltage detecting node to said drain of said second P-channel field-effect transistor, a gate connected to a common node between said turned on field-effect transistor and said first N-channel enhancement mode transistor, and a source connected to the ground; and
   an inverter connected between said power supply and the ground, and having an input terminal connected to said voltage detecting node and an output terminal for providing a voltage detected result.

2. A circuit for detecting a power supply voltage in a memory system, according to claim 1, wherein:
   an equivalent resistance of said N-channel depletion mode field-effect transistor is larger than that of said first P-channel field-effect transistor; and
   an equivalent resistance of said first N-channel enhancement mode field-effect transistor is larger than that of said turned-on field effect transistor.

3. A circuit for detecting a power supply voltage in a memory system, according to claim 1, wherein:
   said first P-channel field-effect transistor is of an enhancement mode type;
   said turned-on field-effect transistor is an N-channel depletion mode field-effect transistor; and
   said second P-channel field-effect transistor is of an enhancement mode type.

* * * * *